United States Patent
Azami et al.

(10) Patent No.: US 7,586,478 B2
(45) Date of Patent: *Sep. 8, 2009

(54) SEMICONDUCTOR DEVICE

(75) Inventors: Munehiro Azami, Kanagawa (JP); Shou Nagao, Kanagawa (JP); Yoshifumi Tanada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 14 days.

This patent is subject to a terminal disclaimer.

(21) Appl. No.: 11/270,647

(22) Filed: Nov. 10, 2005

(65) Prior Publication Data
US 2006/0061384 A1 Mar. 23, 2006

Related U.S. Application Data

(63) Continuation of application No. 10/123,251, filed on Apr. 17, 2002, now Pat. No. 6,975,142.

(30) Foreign Application Priority Data
Apr. 27, 2001 (JP) ............................. 2001-133431

(51) Int. Cl.
G09G 3/36 (2006.01)
H03K 19/0175 (2006.01)

(52) U.S. Cl. .................. 345/100; 345/98; 345/204; 326/88; 326/83; 326/81; 327/390; 257/72; 257/350

(58) Field of Classification Search .............. 326/83, 326/88, 81, 119; 327/390; 345/98–100, 345/204–206, 211–213

See application file for complete search history.

(56) References Cited

U.S. PATENT DOCUMENTS 3,506,851 A 4/1970 Polkinghorn et al.
3,774,055 A 11/1973 Bapat (Continued)

FOREIGN PATENT DOCUMENTS

CN 1 118 521 3/1996

(Continued)

OTHER PUBLICATIONS

Communication from European Patent Office (Search Report) dated Aug. 16, 2002 (4 pages).
Foreign Communication in Singapore Application No. 200204339-6 and Australian Patent Office Search Report, Feb. 25, 2004, 5 pages.
Office Action of Application No. 02118504.2, Jul. 29, 2005, 15 pages.

(Continued)

Primary Examiner—Vibol Tan
(74) Attorney, Agent, or Firm—Fish & Richardson P.C.

(57) ABSTRACT

There is provided a semiconductor device in which fabrication steps can be reduced by constructing a circuit using only TFTs of one conductivity type and in which a voltage amplitude of an output signal can be normally obtained. A capacitance (205) is provided between a gate and a source of a TFT (203) connected to an output node, and a circuit formed of TFTs (201) and (202) has a function to bring a node α into a floating state. When the node α is in the floating state, a potential of the node α is caused higher than VDD by using gate-source capacitance coupling of the TFT (203) through the capacitance (205), thus an output signal having an amplitude of VDD-GND can be normally obtained without causing amplitude attenuation due to the threshold value of the TFT.

53 Claims, 10 Drawing Sheets

U.S. PATENT DOCUMENTS

| | | | |
|---|---|---|---|
| 3,898,479 A | 8/1975 | Proebsting |
| 4,090,096 A | 5/1978 | Nagami |
| 4,390,803 A | 6/1983 | Koike |
| 4,412,139 A | 10/1983 | Horninger |
| 4,633,105 A | 12/1986 | Tsujimoto |
| 4,804,870 A | 2/1989 | Mahmud |
| 4,959,697 A | 9/1990 | Shier et al. |
| 5,467,038 A | 11/1995 | Motley et al. |
| 5,548,143 A | 8/1996 | Lee |
| 5,643,826 A | 7/1997 | Ohtani et al. |
| 5,694,061 A | 12/1997 | Morosawa et al. |
| 5,744,824 A | 4/1998 | Kousai et al. |
| 5,870,071 A | 2/1999 | Kawahata |
| 5,889,291 A | 3/1999 | Koyama et al. |
| 5,949,271 A | 9/1999 | Fujikura |
| 5,949,398 A | 9/1999 | Kim |
| 5,952,991 A | 9/1999 | Akiyama |
| 6,040,810 A | 3/2000 | Nishimura |
| 6,049,228 A | 4/2000 | Moon |
| 6,091,393 A | 7/2000 | Park |
| 6,384,804 B1 | 5/2002 | Dodabalapur et al. |
| 6,501,098 B2 | 12/2002 | Yamazaki |
| 6,522,323 B1 | 2/2003 | Sasaki et al. |
| 6,535,185 B2 | 3/2003 | Kim et al. |
| 6,542,138 B1 | 4/2003 | Shannon et al. |
| 6,653,996 B2 | 11/2003 | Komiya |
| 6,686,899 B2 | 2/2004 | Miyazawa et al. |
| 6,730,966 B2 | 5/2004 | Koyama |
| 6,756,816 B2 | 6/2004 | Miyake |
| 6,813,332 B2 | 11/2004 | Nagao et al. |
| 2001/0002703 A1 | 6/2001 | Koyama |
| 2001/0045565 A1 | 11/2001 | Yamazaki |
| 2002/0011973 A1 | 1/2002 | Komiya |
| 2002/0044208 A1 | 4/2002 | Yamazaki et al. |
| 2002/0097212 A1 | 7/2002 | Miyazawa et al. |
| 2002/0158666 A1 | 10/2002 | Azami et al. |
| 2002/0167026 A1 | 11/2002 | Azami et al. |
| 2002/0190326 A1 | 12/2002 | Nagao et al. |
| 2003/0011584 A1 | 1/2003 | Azami et al. |
| 2003/0020520 A1 | 1/2003 | Miyake et al. |
| 2003/0034806 A1 | 2/2003 | Azami |
| 2003/0052324 A1 | 3/2003 | Kimura |
| 2003/0111677 A1 | 6/2003 | Miyake |

FOREIGN PATENT DOCUMENTS

| | | |
|---|---|---|
| EP | 0 651 431 | 5/1995 |
| EP | 1063630 A2 | 12/2000 |
| EP | 1139326 A2 | 10/2001 |
| JP | 55-156427 | 12/1980 |
| JP | 59-016424 | 1/1984 |
| JP | 60-140924 | 7/1985 |
| JP | 63-204815 | 8/1988 |
| JP | 03-165171 | 7/1991 |
| JP | 06-098081 | 4/1994 |
| JP | 09-186312 | 7/1997 |
| JP | 09-246936 | 9/1997 |
| JP | 2000-106617 | 4/2000 |
| JP | 2001-005426 | 1/2001 |
| JP | 2001-109394 | 4/2001 |
| JP | 2001-133431 | 5/2001 |
| JP | 2002-176162 | 6/2002 |
| JP | 2002/251164 | 9/2002 |

OTHER PUBLICATIONS

Munehiro Azami et al.; U.S. Appl. No. 10/127,600; Office Action dated Oct. 22, 2004.

Singapore Patent Office Communication dated Jun. 25, 2004 for Singapore Patent Application No. 200202969-2, including Australian Search Report and Written Opinion (8 pages).

European Search Report (Application No. 02008653.4), dated Dec. 13, 2007.

SEMICONDUCTOR DEVICE

CROSS-REFERENCE TO RELATED APPLICATIONS

This application is a continuation application of U.S. application Ser. No. 10/123,251, filed Apr. 17, 2002, now U.S. Pat. No. 6,975,142 and claims the benefit of a foreign priority application filed in Japan as Serial No. 2001-133431 on Apr. 27, 2001. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a semiconductor device. The semiconductor device means any device which can function by using semiconductor characteristics. Further, the present invention relates to a driving circuit of a display device. Additionally, the present invention includes electronic equipment fabricated by using the driving circuit of the display device. Note that, in the present specification, the display device includes a liquid crystal display device obtained by using a liquid crystal element for a pixel, and a light emitting display device obtained by using a self-luminous element such as an organic electroluminescence (EL) element or the like. The driving circuit means a circuit for carrying out a processing to input image signals to pixels arranged in the display device and to display an image, and includes a pulse circuit such as a shift register or the like, and an amplifying circuit such as an amplifier or the like.

2. Description of the Related Art

In recent years, a semiconductor device (a display device) in which a semiconductor thin film is formed on an insulator, especially on a glass substrate, especially an active matrix type display device using a thin film transistor (hereinafter referred to as a TFT) has come into wide use remarkably. The active matrix type display device using the TFT includes hundreds of thousands to millions of pixels which are arranged so as to be formed into a matrix shape, and an electric charge of each of the pixels is controlled by a TFT arranged in each of the pixels, so that an image is displayed.

Further, as a recent technique, a technique relating to a polysilicon TFT in which a driving circuit is simultaneously formed using TFTs in a region around a pixel portion, in addition to a pixel TFT constituting a pixel, has been developed, which greatly contributes to the miniaturization of a device and the reduction in consumed electric power, and as a result of that, the display device becomes an indispensable device for a display portion etc. of a mobile information terminal an application field of which is remarkably expanded in recent years.

As the semiconductor device (the driving circuit of the display device), a CMOS circuit in which an N-type TFT and a P-type TFT are combined is usually employed. The CMOS circuit is characterized by the following two points: a current flows only at an instant when a logic is changed and a current does not flow during a period in which a certain logic is held; and a current flows only at an instant when a logic is changed and there is only a minute leak current during a period in which a certain logic is held (although the preferable leak current is zero). The CMOS circuit has the foregoing two characteristics, thus the CMOS circuit has advantages such that the consumed current in the whole circuit can be reduced, and high speed driving can be excellently performed.

Note that, the term "logic" indicates an H level or an L level. Also, the term "logic change" indicates that the H level is changed to the L level or the L level is changed to the H level.

As mobile electronic equipment is miniaturized and is reduced in weight, demand for a display device using liquid crystal or self-luminous elements is rapidly increased, however, from the viewpoint of the yield and the like, it is difficult to reduce the manufacturing cost to the level sufficiently low. It is easily supposed that the demand is further rapidly increased in future, and accordingly, it is desired that the display device can be supplied more inexpensively.

As a method of fabricating a driving circuit on an insulator, there is a common method in which patterns of active layers, wiring lines and the like are formed through exposure treatment and etching with a plurality of photomasks. However, the number of steps during this processing directly influences the manufacturing cost, therefore it is ideal to manufacture the device at the number of the steps as small as possible. Then, the driving circuit, which is conventionally constituted by the CMOS circuit, is constituted by using TFTs the conductivity type of which belongs to either of the N type or the P type. With this method, a part of an ion doping step can be omitted, and the number of the photomasks can also be decreased.

However, if the driving circuit is constructed by using TFTs the conductivity type of which belongs to either of the N type or the P type, the following problem occurs. This problem will be explained below.

FIG. 9A shows examples of a CMOS inverter (I) which is conventionally used in general, and inverters (II) and (III) which are constituted by using TFTs of the polarity of any one of the N type and the P type. The inverter (II) is a TFT load-type inverter, and the inverter (III) is a resistance load-type inverter. Hereinafter, the respective operations will be described.

FIG. 9B shows a waveform of a signal inputted to the inverter. Here, it is assumed that an input signal amplitude has VDD-GND (GND<VDD). Specifically, it is assumed that GND=0 [V].

Note that, the foregoing term "VDD-GND" denotes a range from a potential denoted by VDD to a potential denoted by GND. In the present specification, a range of the potentials is referred by giving the symbol "-" in the middle of GND, VDD, and the like that denote each of the potentials. For example, GND-VDD1 represents a range from the potential denoted by GND to the potential denoted by VDD1. Also, in the present specification, as an exception such as a gate-source voltage, there is a case where the symbol "-" is given in the middle of a gate and a source. The gate-source voltage in this case denotes the voltage generated between a gate electrode and a source of a transistor and does not denote the range between the gate and the source.

A circuit operation will be explained. Note that, for clarification and simplification of the explanation, it is assumed that the threshold voltages of N-type TFTs constituting a circuit are not irregular and are uniformly defined as VthN. Similarly, the threshold voltages of P-type TFTs are uniformly defined as VthP.

When a signal as shown in FIG. 9B is inputted to the CMOS inverter in the state that the potential of the input signal is at the H level (VDD), a P-type TFT 901 is turned OFF and an N-type TFT 902 is turned ON, so that the potential of an output node comes to have the L level (GND). On the contrary, when the potential of the input signal is at the L level, the P-type TFT 901 is turned ON and the N-type TFT 902 is turned OFF, so that the potential of the output node comes to have the H level (FIG. 9C).

Next, the operation of the TFT load-type inverter (II) will be described. Similarly a case where a signal as shown in FIG. 9B is inputted will be considered. First, when the input signal is at the L level, an N-type TFT 904 is turned OFF. On the other hand, a load TFT 903 always operates under saturation condition, therefore the potential of an output node is raised in a direction of the H level. On the other hand, when the input signal is at the H level, the N-type TFT 904 is turned ON. Here, the current capacity of the N-type TFT 904 is made sufficiently higher than that of the load TFT 903, so that the potential of the output node is lowered in a direction of the L level.

Also with respect to the resistance load-type inverter (III), similarly, if the ON resistance value of an N-type TFT 906 is made sufficiently lower than that of a load resistor 905, when an input signal is at the H level, the N-type TFT 906 is turned ON, so that the potential of an output node is lowered in a direction of the L level. When the input signal is at the L level, the N-type TFT 906 is turned OFF, so that the potential of the output node is raised in a direction of the H level.

However, when the TFT load type inverter or the resistance load-type inverter is used, there is a problem as described below. FIG. 9D shows an output waveform of the TFT load-type inverter. When the output is at the H level, the potential becomes lower than VDD by the amount denoted by numeral 907. In the load TFT 903, when a terminal of an output node side is a source, and a terminal of a power source VDD side is a drain, a gate electrode and a drain region are connected to each other. Therefore, the potential of the gate electrode at this time is VDD. Also, under the condition allowing the load TFT in an ON state, the gate-source voltage of the TFT 903 is larger than VthN, resulting in that the potential of the output node rises to at most a value (VDD−VthN) obtained by subtracting VthN from VDD. That is, the value denoted by numeral 907 is equal to VthN. Further, according to the ratio of the current capacity of the load TFT 903 to that of the N-type TFT 904, when the output potential is at the L level, the potential becomes higher than GND by the amount denoted by numeral 908. In order to make this sufficiently close to GND, the current capacity of the N-type TFT 904 has to be set sufficiently high as compared with the load TFT 903. Similarly, FIG. 9E shows an output waveform of the resistance load type inverter. According to the ratio of the resistance value of the load resistor 905 to the ON resistance of the N-type TFT 906, the potential becomes high by the amount indicated by numeral 909. That is, when the inverter constituted by the TFTs of only one polarity shown here is employed, amplitude attenuation of the output signal occurs relative to the amplitude of the input signal. In order to form the driving circuit, the output has to be obtained without attenuating the amplitude.

SUMMARY OF THE INVENTION

The present invention has been made in view of the above problem, and an object of the invention is to provide a semiconductor device (a driving circuit of a display device) which can be fabricated at low costs by using TFTs of only one polarity of either of an N type or a P type to reduce manufacturing steps and which can obtain an output without amplitude attenuation.

In the foregoing TFT load-type inverter (II) shown in FIG. 9A, consideration will be given to a condition under which the amplitude of the output signal normally takes VDD-GND. First, in a circuit as shown in FIG. 1A, when the potential of an output signal comes to have the L level, a resistance value between the power source GND and an output node has only to be sufficiently low as compared with a resistance value between the power source VDD and the output node so that the potential is caused sufficiently close to GND. That is, an N-type TFT 101 has only to be in an OFF state during a period in which an N-type TFT 102 is in an ON state. Second, when the potential of the output signal comes to have the H level, in order to cause the potential equal to VDD, an absolute value of a gate-source voltage of the N-type TFT 101 has only to always exceed VthN. That is, in order to satisfy the condition under which the H level of the output node becomes VDD, the potential of the gate electrode of the N-type TFT 101 has to be set higher than a value (VDD+VthN) obtained by adding the potential of the power source VDD to that of the threshold value VthN. The power source supplied to the circuit includes only two kinds such as VDD and GND. Therefore, if there is no third power source having a potential higher than VDD, the condition can not be satisfied.

Then, in the present invention, means as described below is devised. As shown in FIG. 1B, a capacitance 103 is provided between the gate and the source of the N-type TFT 101. The gate electrode of the N-type TFT 101 has some potential and is brought into a floating state, and then the potential of the output node is raised, resulting in that with the rise of the potential of the output node, the potential of the gate electrode of the N-type TFT 101 is also raised by capacitance coupling with the capacitance 103. When this effect is used, it becomes possible to make the potential of the gate electrode of the N-type TFT 101 higher than VDD, more accurately, than the value (VDD+VthN) obtained by adding the potential of the power source VDD and the potential of the threshold value VthN. Thus, the potential of the output node is allowed to be raised sufficiently to VDD.

Note that, with respect to the capacitance 103 shown in FIG. 1B, a capacitance portion may be actually fabricated, or a parasitic capacitance between the gate and the source of the TFT 101 may be used.

The structure of the present invention will be described hereinbelow.

A semiconductor device according to the present invention is characterized by comprising: a first transistor having a first impurity region connected to a first power source; a second transistor having a first impurity region connected to a second power source; a third transistor having a first impurity region connected to the first power source; and a fourth transistor having a first impurity region connected to the second power source, wherein: the first to fourth transistors have a same conductivity type; a second impurity region of the first transistor and a second impurity region of the second transistor are connected to one terminal of a capacitance; a second impurity region of the third transistor, a second impurity region of the fourth transistor, and a gate electrode of the first transistor are connected to the other terminal of the capacitance; a gate electrode of the second transistor and a gate electrode of the fourth transistor are connected to an input signal line; and a gate electrode of the third a transistor is connected to the first power source.

A semiconductor device according to the present invention is characterized by comprising: a first transistor having a first impurity region connected to a first power source; a second transistor having a first impurity region connected to a second power source; a third transistor having a first impurity region connected to the first power source; a fourth transistor having a first impurity region connected to the second power source; and a capacitance, wherein: the first to fourth transistors have a same conductivity type; a second impurity region of the first transistor and a second impurity region of the second transistor are connected to one terminal of the capacitance; a second impurity region of the third transistor, a second impurity region of the fourth transistor, and a gate electrode of the first transistor are connected to the other terminal of the capacitance; a gate electrode of the second transistor and a gate electrode of the fourth transistor are connected to a first input signal line; and a gate electrode of the third transistor is connected to a second input signal line.

DETAILED DESCRIPTION OF THE PREFERRED EMBODIMENTS

Figure 1A:
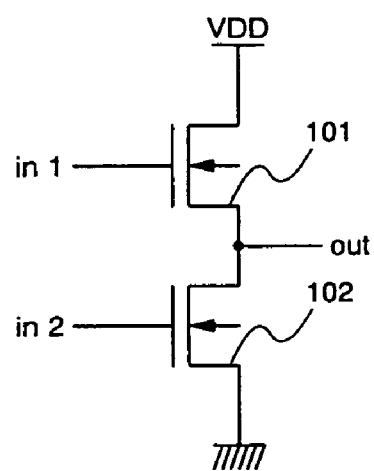
FIGS. 1A and 1B are views for explaining the operation principle of a semiconductor device (a driving circuit of a display device) of the present invention.
Figure 1B:
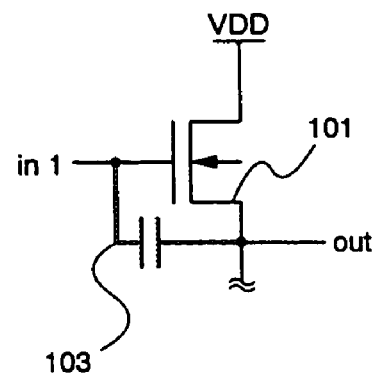
Figure 2A:
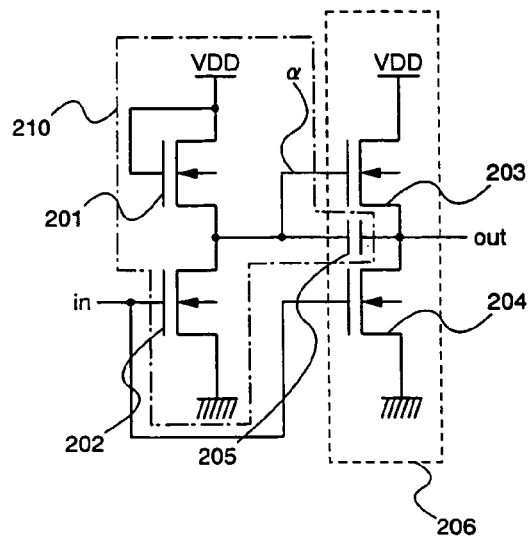
FIGS. 2A to 2D are views showing an inverter of a basic mode of a semiconductor device (a driving circuit of a display device) of the present invention and waveforms of its input/output signals.

FIG. 2A shows an embodiment of a semiconductor device (a driving circuit of a display device) of the present invention, which is a circuit functioning as an inverter. The circuit is constituted by N-type TFTs 201 to 204, and a capacitance 205, and a portion surrounded by a dotted line frame 206 is equivalent to the circuit shown in FIG. 1A. A portion surrounded by a dotted line frame 210 forms an output amplitude compensating circuit. The output amplitude compensating circuit 210 is formed for bringing a floating state to a gate electrode of the N-type TFT 203, and as long as the same function is obtained, the circuit is not limited to the structure of FIG. 2A.

In the circuit of FIG. 2A, an input signal is inputted to gate electrodes of the N-type TFT 202 and the N-type TFT 204. The N-type TFT 201 functions as a load, and an output given from a circuit constituted by the N-type TFTs 201 and 202 is inputted to the gate electrode of the N-type TFT 203. Note that, in FIG. 2A, an output node given from the circuit constituted by the N-type TFTs 201 and 202 is referred as α.

The operation of the circuit will be described in sequence. Note that, power source potentials are referred as VDD and GND, and the amplitude of an input signal is referred as VDD (H level)-GND (L level). First, when the potential of the input signal is at the H level, the N-type TFTs 202 and 204 are turned ON. Here, since a gate electrode and a drain region are connected, the N-type TFT 201 operates in a saturated state, however, the current capacity of the N-type TFT 202 is set sufficiently higher than the current capacity of the N-type TFT 201, resulting in that the potential of the node α is lowered to the GND. Accordingly, the N-type TFT 203 is turned OFF, and the output of the L level appears at the output node.

Subsequently, when the potential of the input signal is at the L level, the N-type TFTs 202 and 204 are turned OFF. Thus, the potential of the node α is raised to the VDD side, and when the potential becomes the value (Vdd−VthN) obtained by subtracting the threshold value VthN from the power source VDD, the floating state is once obtained. On the other hand, when the potential of the node α starts to rise, the N-type TFT 203 is turned ON before long, and the potential of the output node is raised to the VDD side. When the node α is brought into the floating state, the potential of the output node remains to continue its rise. Therefore, as the potential of the output node is raised, the potential of the node α in the floating state also rises by the existence of the gate-source capacitance 205 of the N-type TFT 203. Accordingly, the potential of the node α is allowed to be higher than a value (VDD+VthN) obtained by adding the power source VDD and the threshold value VthN. Thus, the output of the H level appears at the output node, and the potential at this time becomes equal to VDD.

Figure 2B:
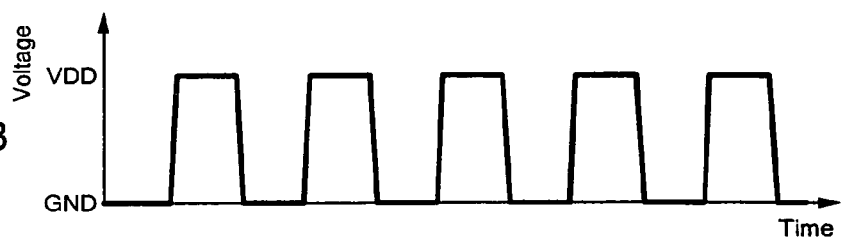
Figure 2C:
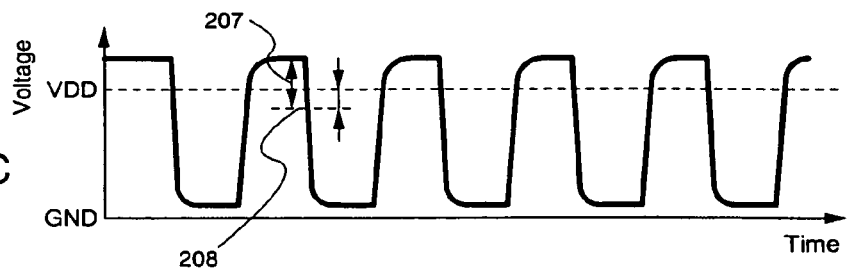
Figure 2D:
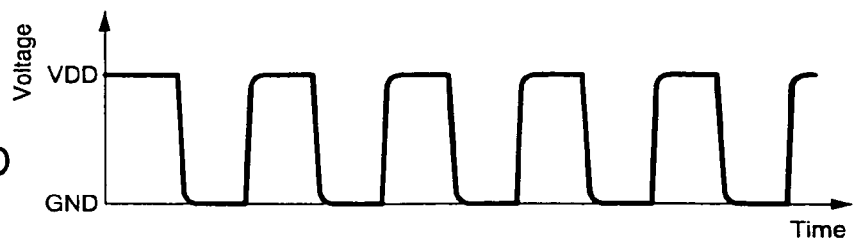

By the above operation, the amplitude of the output signal can be obtained without attenuation relative to the amplitude of the input signal. A method of raising the potential by using the capacitance coupling that is conducted between two positions as stated above is called a bootstrap method. FIG. 2B shows a waveform of the input signal of the circuit shown in FIG. 2A, FIG. 2C shows a waveform of the potential at the node a, and FIG. 2D shows a waveform of the output signal. In FIG. 2C, a potential denoted by numeral 208 is a potential (VDD−VthN) which is lower than VDD by VthN, and the potential of the node α is raised by the amount denoted by numeral 207 through the bootstrap. As a result, as shown in FIG. 2D, when the output node is at the H level, the potential rises to VDD, and the output signal having the amplitude of VDD-GND can be obtained.

Figure 10A:
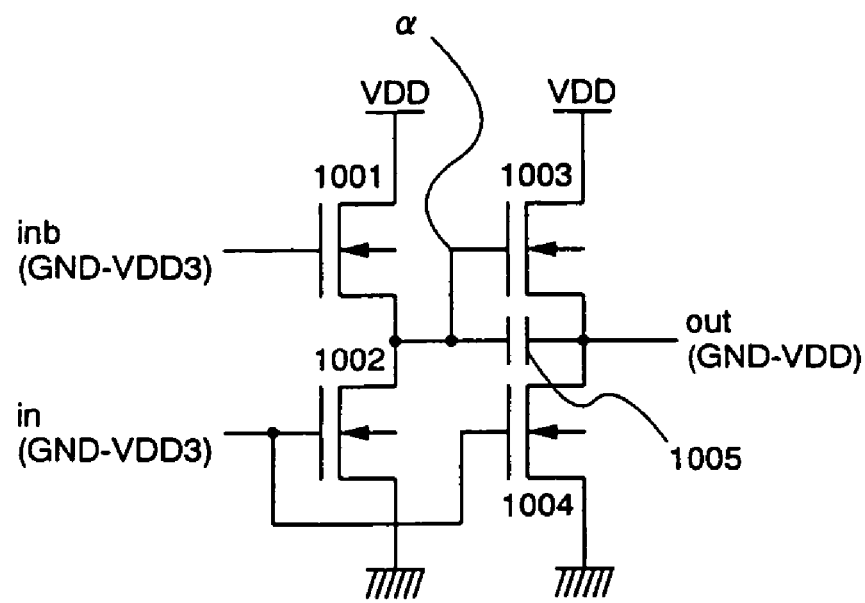
FIGS. 10A and 10B are views for explaining input signals and circuit operations of a four-TFT type inverter and a three-TFT type inverter.
Figure 10B:
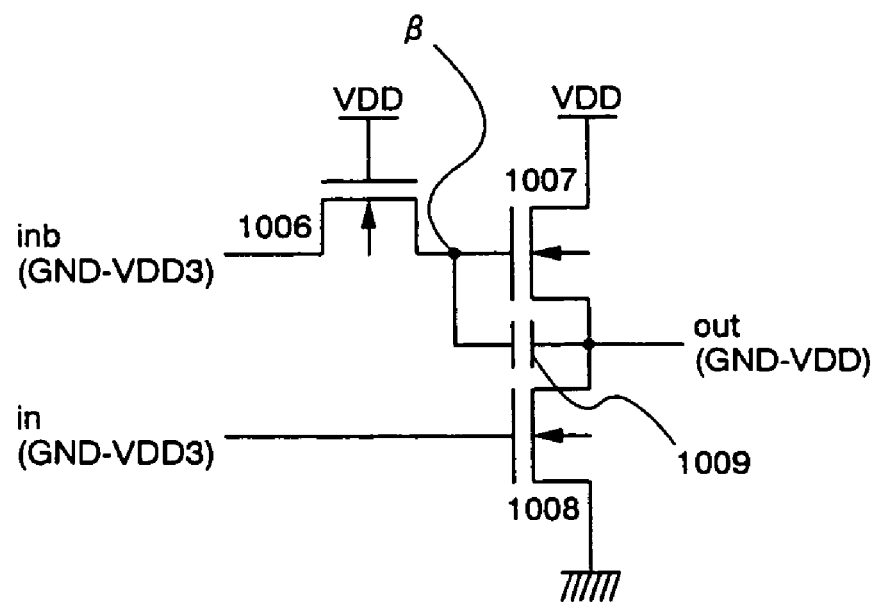

In the semiconductor device (the driving circuit of the display device) of the present invention, although the amplitude compensation of the output signal that is carried out by the bootstrap method is constructed as the base of the operation, at that time, it is assumed that the gate electrode of the TFT using the capacitance coupling is in the floating state. FIGS. 10A and 10B show structural examples of circuits using the bootstrap method. FIG. 10A shows a basic structure of a semiconductor device (a driving circuit of a display device) of the present invention, in which a node α is in a floating state, to thereby raise the potential of the node a by using a gate-source capacitance 1005 of a TFT 1003, and then compensate the amplitude of an output signal by that. FIG. 10B shows a circuit constituted by three TFTs, and similarly, in which a node β is in a floating state, to thereby raise the potential of the node β by using a gate-source capacitance 1009 of the TFT 1007, and then compensate the amplitude of an output signal by that.

Next, consideration will be given to the amplitude of an input signal and a power source potential. Now, a power source potential at a high potential side is referred as VDD; a power source potential at a low potential side, GND; the amplitude of an input signal (in), VDD-GND; and inb, an inversion signal of the input signal. Here, consideration will be given to the states of the node α and the node β in the case where the amplitudes of the signals in and inb have respectively VDD3-GND. The power source GND, the power source VDD3, the power source VDD, the threshold value VthN, and the value (VDD−VthN) obtained by subtracting the threshold value VthN from the power source VDD satisfy the relation of GND<VthN<VDD3<(VDD−VthN). In FIG. 10A, when the signal inb is at the H level, the potential of the gate electrode of the N-type TFT 1001 becomes VDD3. VthN<VDD3 is satisfied, with the result that the N-type TFT 1001 is turned ON, the potential of the node α is raised to the VDD side, and then the floating state is obtained when the potential becomes the value (VDD3−VthN) obtained by subtracting the threshold value VthN from the power source VDD3. That is, if the H level of the signal inb exceeds VthN, the node α can be securely brought into the floating state, and the operation of raising the potential of the gate electrode of the N-type TFT 1003 is enabled by the bootstrap. On the other hand, in FIG. 10B, the potential of the gate electrode of the N-type TFT 1006 is always VDD. Therefore, when the signal inb is at the H level, the potential of the node β is raised to VDD3. However, now, VDD3<(VDD−VthN) is satisfied, resulting in that the N-type TFT 1006 always takes the ON state irrespective of the potential of the input signal. Thus, the node β does not enter the floating state. Accordingly, the potential of the node β can not be raised by the bootstrap. That is, in the case of the circuit shown in FIG. 10B, in order that the node P enters the floating state, there is a minimum condition under which at least the H level is not lower than (VDD−VthN) when the L level of the signal inb is GND. Accordingly, it is disadvantageous in view of low voltage driving and fluctuation in characteristics of TFTs.

As stated above, in the case where the amplitude of an input signal is smaller than a power source voltage, under a certain specific condition, there is a fear that the floating state can not be given to the node β in the structure as shown in FIG. 10B. On the other hand, in the structure of the present invention shown in FIG. 10A, there is a merit that enables the node a to securely bring into the floating state.

The present invention having the structure as described above can provide a semiconductor device which can be fabricated at low cost by using TFTs of only one polarity of either of the N type or the P type to reduce the manufacturing steps and which can obtain the output without amplitude attenuation.

Hereinafter, examples of the present invention will be described.

EXAMPLE 1

In this example, circuits in which a plurality of stages of inverters are connected using the present invention will be described with reference to FIGS. 3A to 3C.

Figure 3A:
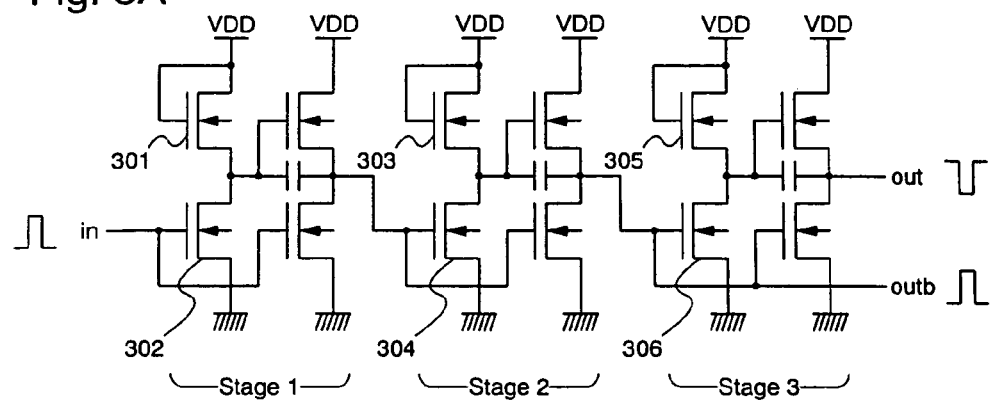
FIGS. 3A to 3C are views showing connection examples in which an inverter of a basic mode of a semiconductor device (a driving circuit of a display device) of the present invention is used by connecting a plurality of stages thereof.

FIG. 3A shows a circuit in which a plurality of stages of inverters each of which is a mode of a semiconductor device (a driving circuit of a display device) of the present invention are connected. In the driving circuit of the display device or the like, such a circuit is often used as a buffer. In the semiconductor device of the present invention shown in FIG. 3A, manufacturing steps are reduced by using TFTs of only one polarity of either of the N type or the P type, so that it can be fabricated at low cost. Further, an output without amplitude attenuation can be obtained. However, in the case where the circuit as shown in FIG. 3A is employed, the following point should be noted in view of consumed electric power of the circuit.

In FIG. 3A, when an input signal is at the H level, an N-type TFT 302 is turned ON. Here, an N-type TFT 301 functions as a load in which its gate and drain are short-circuited, and always operates in saturation. Thus, when the N-type TFT 302 is turned ON, a through current flows between VDD and GND. The same applies to TFTs 303, 304 and 305, 306 of respective stages. As a result, consumed current becomes large.

Figure 3B:
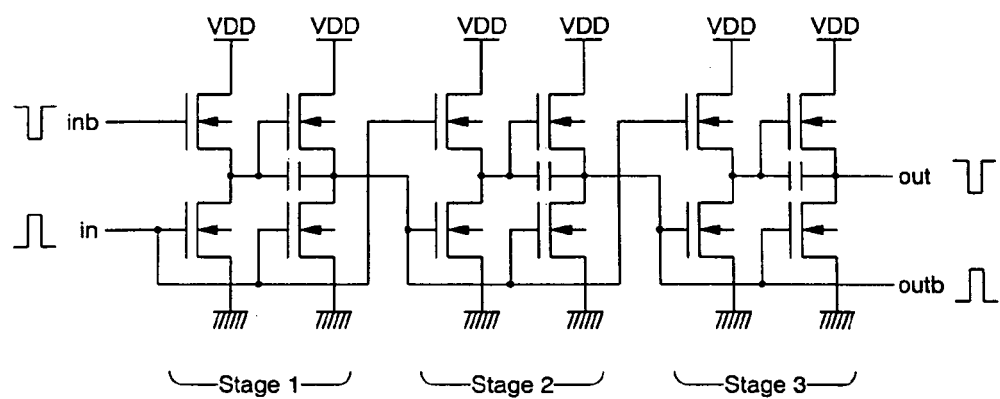

As an example for avoiding such a problem, as shown in FIG. 3B, a method of using a two-input type inverter can be mentioned. In the case of such a circuit, in TFTs arranged between VDD and GND, polarities of input signals are always opposite to each other. Therefore, an exclusive operation is carried out, so that a through current does not flow.

However, in the case where the circuit of FIG. 3B is used, it is necessary to prepare two-phase signals of inversion and non-inversion as input signals.

Figure 3C:
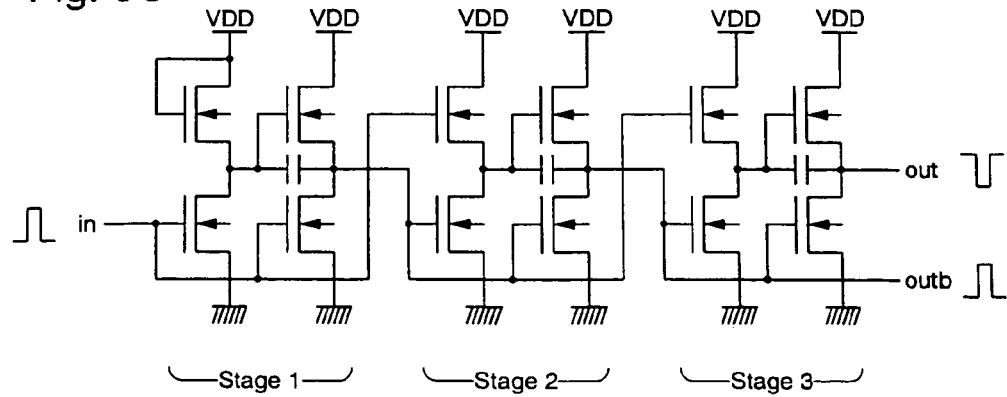

Then, as the configuration of combination of both the semiconductor device shown in FIG. 3A and the semiconductor device shown in FIG. 3B, as shown in FIG. 3C, the one-input type inverter of the present invention is used for the first stage, and the two-input type inverters are used for the second stage and the following. As the inputs of the second stage, the output signal of the former stage is inputted as one of them, and the input signal of the former stage is inputted as the other. Thus, the circuit can be used as a buffer which is of one-input type and in which the through current is suppressed to a minimum.

In the semiconductor device of the present invention having the structure as described above, since the manufacturing steps can be reduced by using the TFTs of only one polarity of either of the N type or the P type, it can be fabricated at low cost, and the output without amplitude attenuation can be obtained.

EXAMPLE 2

A semiconductor device (a driving circuit of a display device) of the present invention can easily function as a level shifter by giving a potential which is different from an amplitude potential of an input signal as a power source potential supplied to a circuit. An example will be described below.

First, as power source potentials, three potentials such as GND, VDD1, and VDD2 are considered, and it is assumed that they have the magnitude relation of GND<VDD1<VDD2. At this time, consideration will be given to a case where a signal having an amplitude of GND-VDD1 is inputted and is converted into a signal having an amplitude of GND-VDD2, and then the signal is extracted.

Figure 4A:
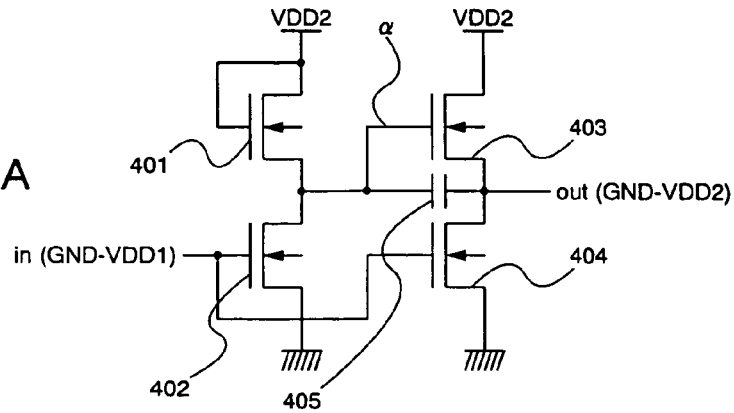
FIGS. 4A to 4D are views showing a level shifter shown as an example of a semiconductor device (a driving circuit of a display device) of the present invention and waveforms of its input/output signals.

FIG. 4A shows an example. The structure of a circuit may be the same as the embodiment and the example 1. The amplitude of an input signal has GND-VDD1, and potentials of power sources connected to ends of impurity regions of N-type TFTs 401 and 403 are referred as VDD2.

Figure 4B:
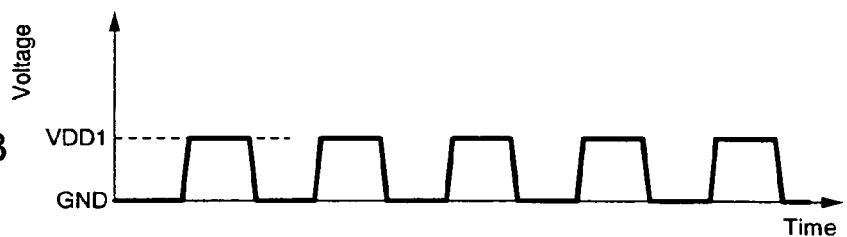

The operation of the circuit will be described. FIG. 4B shows a waveform of an input signal. The signal having an amplitude of GND-VDD1 is inputted to gate electrodes of N-type TFTs 402 and 404. When the input signal is at the H level, the N-type TFTs 402 and 404 are turned ON, the potential at a node α is lowered to the GND side, and the N-type TFT 403 is turned OFF. Thus, the potential at the output node comes to have the L level.

Figure 4C:
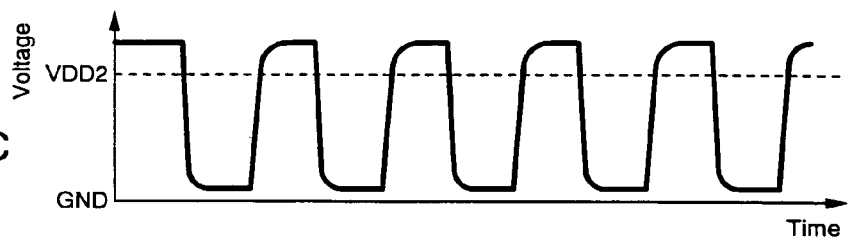
Figure 4D:
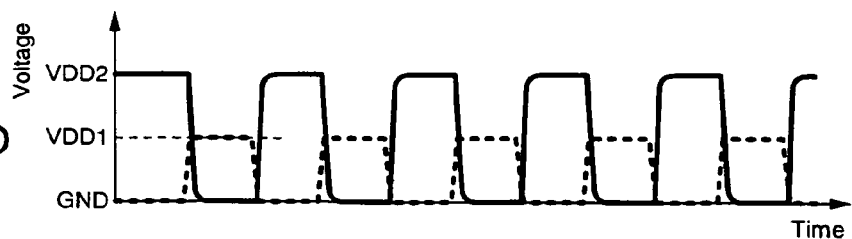

When the input signal is at the L level, the N-type TFTs 402 and 404 are turned OFF, and the potential at the node α is raised to the VDD2 side. Accordingly, the N-type TFT 403 is turned ON, and the potential of the output node rises. On the other hand, at the node α, when the potential becomes the value (VDD2—absolute value of threshold voltage of the N-type TFT 403) obtained by subtracting the absolute value of the threshold voltage of the N-type TFT 403 from the power source VDD2, it is brought into the floating state. Thereafter, as the potential of the output node rises, the potential of the node α is further raised by a b capacitance coupling 405 existing between the gate and source of the N-type TFT 403, and then takes a potential higher than VDD2 (FIG. 4C). Thus, the potential of the output node comes to have the H level, and the signal having the amplitude of GND-VDD is outputted (a solid line of FIG. 4D).

Figure 5A:
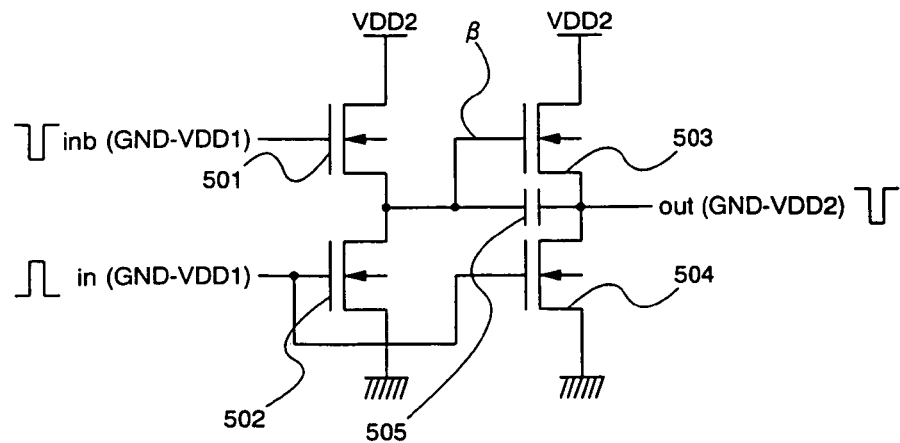
FIGS. 5A and 5B are views for explaining the operation of a level shifter and showing a structural example of the level shifter, respectively.

As the reason why the circuit shown in this example can be easily used as the level shifter, it is possible to mention a point that a signal input of a low voltage amplitude is not applied to gate electrodes of the TFTs 401 and 403 connected to the high potential side power source (VDD2). In a two-input type circuit shown in FIG. 5A, even if a signal of a low voltage amplitude is inputted to a TFT 501 connected to a high potential side power source (VDD2), the potential of a node β can rise at most to the vicinity of VDD1. Accordingly, a TFT 503 can not be sufficiently turned ON as well, and the gate electrode potential of the TFT 503 can not be raised by using capacitance coupling, so that a normal operation thereof can not be achieved.

Figure 5B:
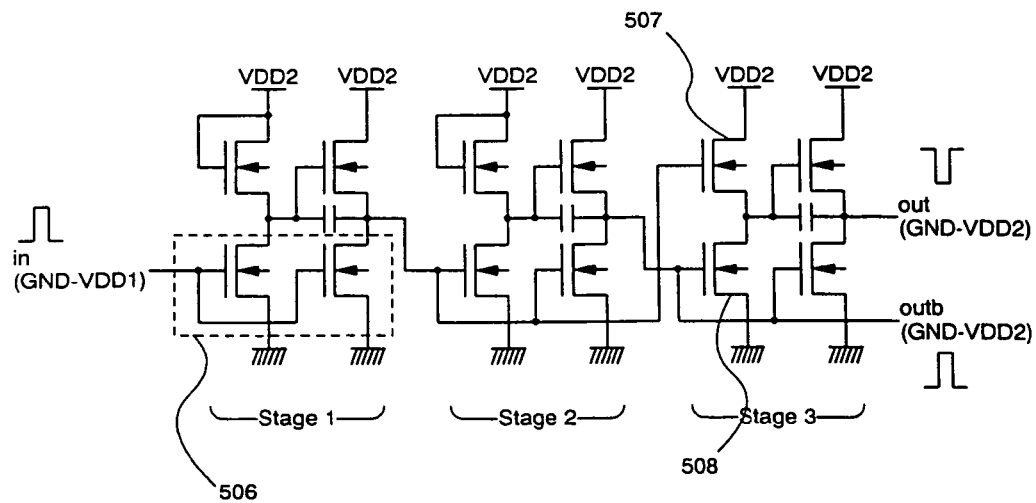

Thus, in the case where heavy load is applied immediately after the level shifter shown in this example and a structure such as a buffer is required, as shown in FIG. 5B, it is necessary that two stages of one-input type circuits are used and all amplitudes of input signals thereafter are made high voltage amplitudes. In FIG. 5B, TFTs to which a signal of a low voltage amplitude is inputted are limited to TFTs of a portion surrounded by a dotted line frame 506, and when two stages of one-input type circuits are connected, signals of high voltage amplitudes are inputted to two inputs (inputs to gate electrodes of TFTs 507 and 508) of a third stage, so that the normal operation can be carried out.

Figure 6:
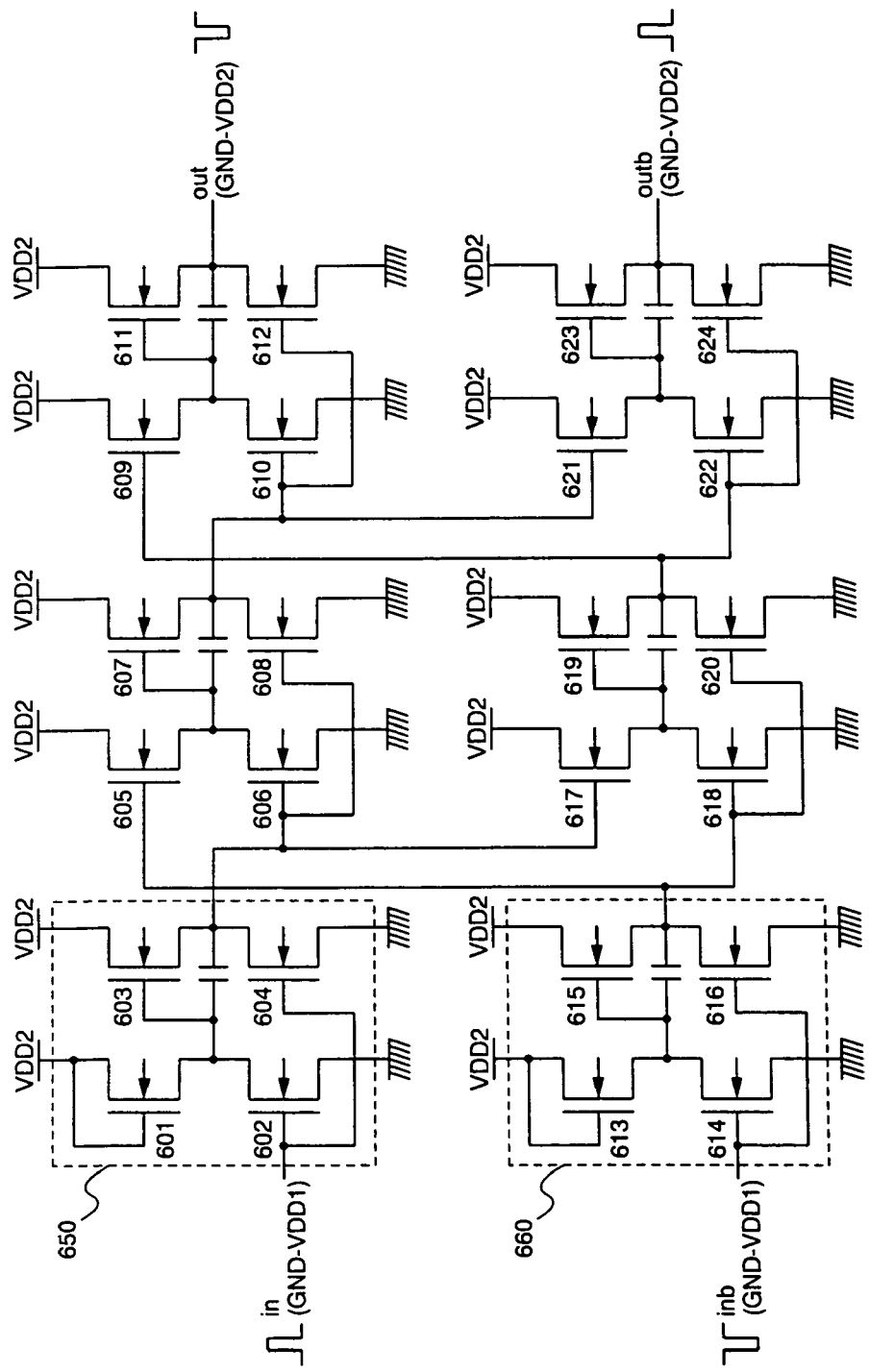
FIG. 6 is a view showing a structural example of a two-input type level shifter in a case where an inversion signal is included.

In the case where signals for performing amplitude conversion include inverted signals, a structure may be adopted in which mutual output signals are used as inverted inputs of a next stage. FIG. 6 shows an example. Input signals are denoted by "in" and "inb", and are respectively inputted to gate electrodes of TFTs 602 and 614. The output of a first stage level shifter 650 is inputted to second stage TFTs 606 and 617, and the output of a first stage level shifter 660 is inputted to second stage TFTs 605 and 618. Both of the signals inputted to the second stage are ones of high voltage amplitudes, therefore, subsequent level shifters normally function as buffers, and then output signals "out" and "outb" are obtained from the final stage.

In the semiconductor device of the present invention having the structure as described above, the manufacturing steps can be reduced by using the TFTs of only one polarity of either of the N type or the P type, resulting in that it can be fabricated at low cost, and the output without amplitude attenuation can be obtained.

EXAMPLE 3

In this example, a description will be given on an example in which a display device is fabricated by using a semiconductor device (a driving circuit of a display device) of the present invention.

Figure 7:
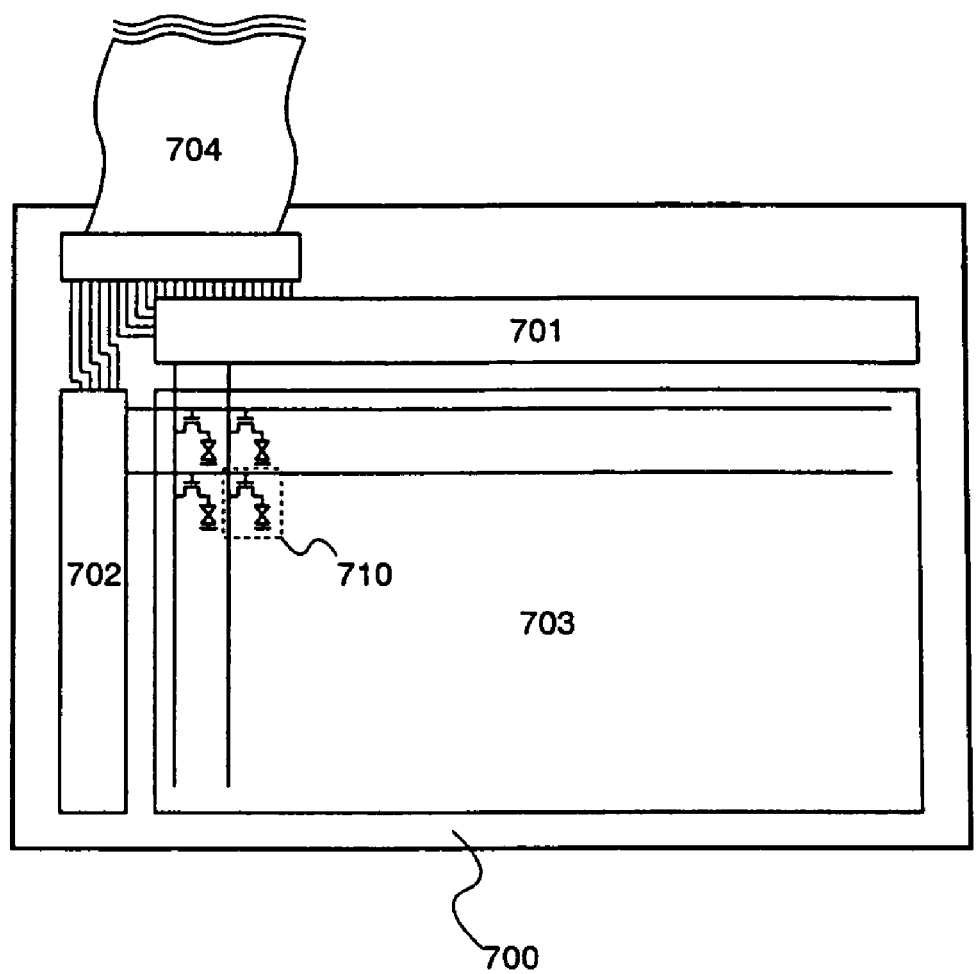
FIG. 7 is a schematic view showing a display device fabricated by applying the present invention.

FIG. 7 is a schematic view of a display device. A source signal line driving circuit 701, a gate signal line driving circuit 702, and a pixel portion 703 are fabricated so as to be integrated on a substrate 700. In the pixel portion, a portion surrounded by a dotted line 710 illustrates one pixel. The example of FIG. 7 shows a pixel of a liquid crystal display device, and one TFT (hereinafter referred to as a pixel TFT) controls an electric charge applied to one electrode of a liquid crystal element. Signal inputs to the source signal line driving circuit 701 and the gate signal line driving circuit 702 are supplied from the outside through a flexible print circuit (FPC) 704.

The substrate having the pixel TFT and the driving circuits may be manufactured in accordance with a known method, for example, as disclosed in U.S. Pat. No. 5,889,291 issued to Koyama et al. Also, it is possible to crystallize a semiconductor film for an active layer of the TFTs by utilizing a metal element for promoting crystallization although other known methods can be used for crystallization. Such a method of using the metal element is disclosed, for example, in U.S. Pat. No. 5,643,826 issued to Ohtani et al. The entire disclosures of these U.S. Pat. Nos. 5,889,291 and 5,643,826 are incorporated herein by reference.

The display device shown in this example is constructed by using the semiconductor device (the driving circuit of the display device) of the present invention, and the driving circuits constituting the whole display device including the pixel portions are fabricated by using only TFTs (for example, N-type TFTs) of one polarity same as that of the pixel TFT. Thus, an ion doping step for giving the P type to a semiconductor layer can be omitted, and this can contribute to a reduction in manufacturing cost and an improvement in yield.

Although the polarity of the TFT constituting the display device of this example is the N type, according to the present invention, needless to say, it becomes possible to constitute the driving circuit and the pixel TFTs by using only P-type TFTS. In this case, an ion doping step to be omitted is one for giving the N type to a semiconductor layer. Also, the present invention can be applied to not only the liquid crystal display device but also any device as long as it is fabricated by integrally forming a driving circuit on an insulator.

EXAMPLE 4

A semiconductor device (a driving circuit of a display device) of the present invention can be applied to fabrication of a display device used for various electronic equipment. Such electronic equipment includes a portable information terminal (electronic notebook, mobile computer, portable telephone, etc.), a video camera, a digital camera, a personal computer, a television, a portable telephone, and the like. FIGS. 8A to 8G show examples of those.

Figure 8A:
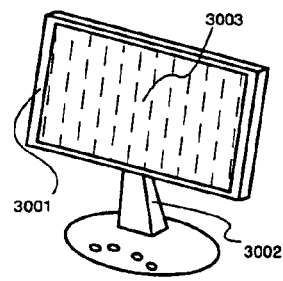
FIGS. 8A to 8G are views showing examples of electronic equipment to which a semiconductor device (a driving circuit of a display device) of the present invention is applied.

FIG. 8A shows a liquid crystal display (LCD) which is constituted by a housing 3001, a supporting stand 3002, a display portion 3003, and the like. The semiconductor device (the driving circuit of the display device) of the present invention can be applied to the fabrication of the display portion 3003.

Figure 8B:
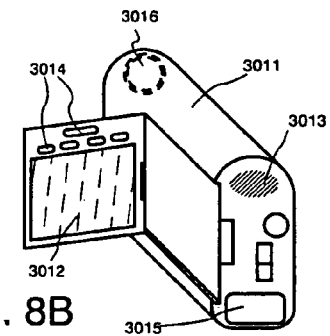

FIG. 8B shows a video camera which is constituted by a main body 3011, a display portion 3012, an audio input portion 3013, an operation switch 3014, a battery 3015, an image receiving portion 3016, and the like. The semiconductor device (the driving circuit of the display device) of the present invention can be applied to the fabrication of the display portion 3012.

Figure 8C:
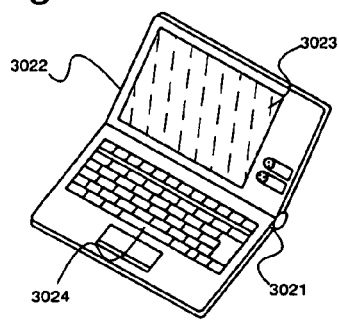

FIG. 8C shows a notebook personal computer which is constituted by a main body 3021, a housing 3022, a display portion 3023, a keyboard 3024, and the like. The semiconductor device (the driving circuit of the display device) of the present invention can be applied to the fabrication of the display portion 3023.

Figure 8D:
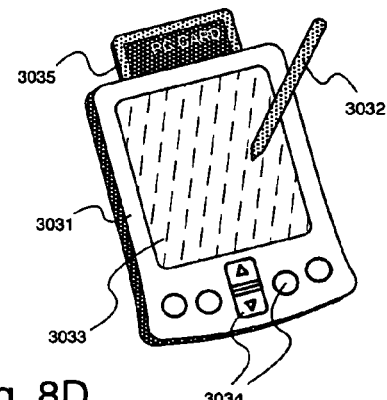

FIG. 8D shows a portable information terminal which is constituted by a main body 3031, a stylus 3032, a display portion 3033, an operation button 3034, an external interface 3035, and the like. The semiconductor device (the driving circuit of the display device) of the present invention can be applied to the fabrication of the display portion 3033.

Figure 8E:
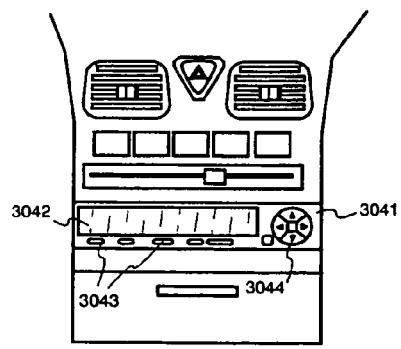

FIG. 8E shows a sound reproducing system, specifically an on-vehicle audio apparatus, which is constituted by a main body 3041, a display portion 3042, operation switches 3043 and 3044, and the like. The semiconductor device (the driving circuit of the display device) of the present invention can be applied to the fabrication of the display portion 3042. Additionally, although the on-vehicle audio apparatus is illustrated in this example, the invention can also be used for a portable or household audio apparatus.

Figure 8F:
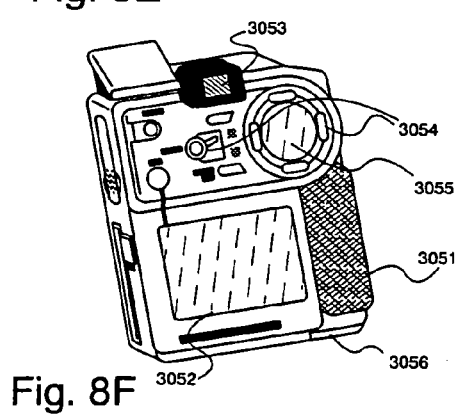

FIG. 8F shows a digital camera which is constituted by a main body 3051, a display portion (A) 3052, an eyepiece portion 3053, an operation switch 3054, a display portion (B) 3055, a battery 3056, and the like. The semiconductor device (the driving circuit of the display device) of the present invention can be applied to the fabrication of the display portion (A) 3052 and the display portion (B) 3055.

Figure 8G:
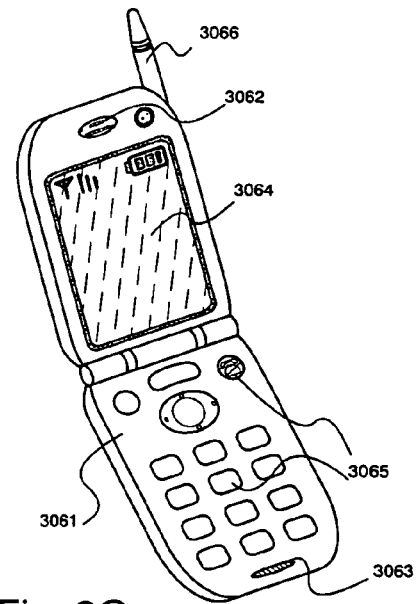
Figure 9A:
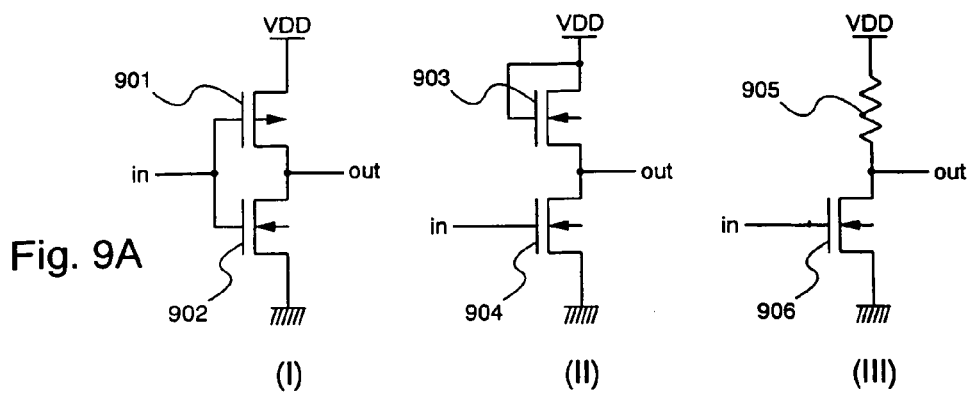
FIGS. 9A to 9E are views showing structures of a conventional CMOS inverter and load type inverters, and waveforms of respective input/output signals.
Figure 9B:
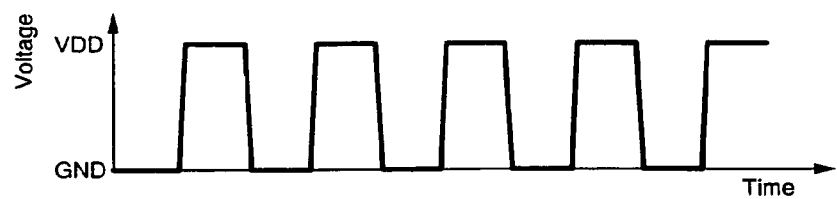
Figure 9C:
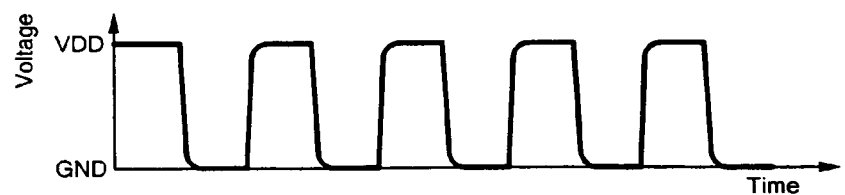
Figure 9D:
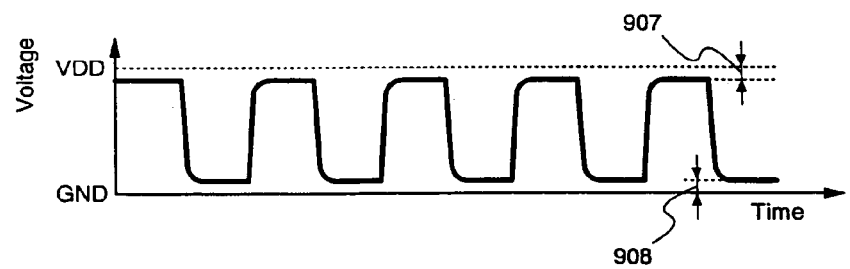
Figure 9E:
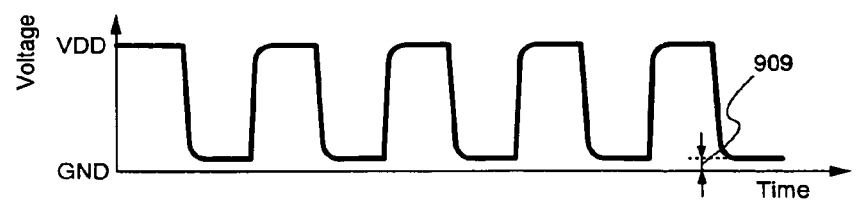

FIG. 8G shows a portable telephone which is constituted by a main body 3061, an audio output portion 3062, an audio input portion 3063, a display portion 3064, an operation switch 3065, an antenna 3066, and the like. The semiconductor device (the driving circuit of the display device) of the present invention can be applied to the fabrication of the display portion 3064.

Note that, the examples set forth above are merely examples, and the present invention is not limited to these applications.

According to the semiconductor device (the driving circuit of the display device) of the present invention, it becomes possible to constitute a driving circuit of a display device and a pixel portion of a display device by use of only TFTs of one conductivity type. Also, fabricating steps of the display device are reduced, to thereby contribute to a reduction in cost and an improvement in yield. As a result, the display device can be supplied more inexpensively. Further, by employing the present invention, the semiconductor device capable of obtaining the output without amplitude attenuation can be provided.

What is claimed is:

1. An active matrix liquid crystal display device comprising:
    a plurality of pixels arranged in a matrix, wherein one of the plurality of pixels includes a fifth thin film transistor; and
    a driver circuit electrically connected to a gate of the fifth thin film transistor,
    wherein the driver circuit comprises:
        a first thin film transistor having a first impurity region electrically connected to a first terminal;
        a second thin film transistor having a first impurity region electrically connected to a second terminal;
        a third thin film transistor having a first impurity region electrically connected to a third terminal;
        a fourth thin film transistor having a first impurity region electrically connected to a fourth terminal; and
        a first power supply line supplied with a first constant potential,
    wherein:
        the first to fourth thin film transistors have a same conductivity type,
        a second impurity region of the first thin film transistor and a second impurity region of the second thin film transistor are electrically connected to a fifth terminal,
        a second impurity region of the third thin film transistor and a second impurity region of the fourth thin film transistor are electrically connected to a gate electrode of the first thin film transistor,
        a gate electrode of the second thin film transistor and a gate electrode of the fourth thin film transistor are electrically connected to a sixth terminal,
        a gate electrode of the third thin film transistor is electrically connected to the first impurity region of the third thin film transistor, and
        the first terminal is electrically connected to the first power supply line.

2. The active matrix liquid crystal display device according to claim 1, wherein the second terminal is electrically connected to a second power supply line supplied with a second constant potential.

3. The active matrix liquid crystal display device according to claim 1, wherein the third terminal is electrically connected to the first power supply line.

4. The active matrix liquid crystal display device according to claim 1, wherein the fourth terminal is electrically connected to a second power supply line supplied with a second constant potential.

5. The active matrix liquid crystal display device according to claim 1, wherein the fifth terminal is an output terminal.

6. The active matrix liquid crystal display device according to claim 1, wherein the sixth terminal is an input terminal.

7. The active matrix liquid crystal display device according to claim 1, wherein the same conductivity type is an N-channel type.

8. The active matrix liquid crystal display device according to claim 1, wherein the same conductivity type is a P-channel type.

9. The active matrix liquid crystal display device according to claim 1, further comprising a capacitor electrically connected between the fifth terminal and the gate electrode of the first thin film transistor.

10. The active matrix liquid crystal display device according to claim 1, wherein the first to fourth thin film transistors are included in one selected from the group consisting of an inverter, a buffer, and a level shifter.

11. An electronic equipment comprising the active matrix liquid crystal display device according to claim 1, wherein the electronic equipment is one selected from the group consisting of a liquid crystal display, a video camera, a notebook personal computer, a portable information terminal, an on-vehicle audio apparatus, a digital camera and a portable telephone.

12. An active matrix liquid crystal display device comprising:
    a plurality of pixels arranged in a matrix, wherein one of the plurality of pixels includes a fifth thin film transistor; and
    a driver circuit electrically connected to a gate of the fifth thin film transistor of a pixel,
    wherein the driver circuit comprises:
        a first thin film transistor having a first impurity region electrically connected to a first terminal;
        a second thin film transistor having a first impurity region electrically connected to a second terminal;
        a third thin film transistor having a first impurity region electrically connected to a third terminal; and
        a fourth thin film transistor having a first impurity region electrically connected to a fourth terminal, wherein:
the first to fourth thin film transistors have a same conductivity type,
a second impurity region of the first thin film transistor and a second impurity region of the second thin film transistor are electrically connected to a fifth terminal,
a second impurity region of the third thin film transistor and a second impurity region of the fourth thin film transistor are electrically connected to a gate electrode of the first thin film transistor,
a gate electrode of the second thin film transistor and a gate electrode of the fourth thin film transistor are electrically connected to a sixth terminal,
a gate electrode of the third thin film transistor is electrically connected to the first impurity region of the third thin film transistor, and
the first terminal is electrically connected to the third terminal.

13. The active matrix liquid crystal display device according to claim 12, wherein the second terminal is provided to be supplied with a second power source potential.

14. The active matrix liquid crystal display device according to claim 12, wherein the third terminal is provided to be supplied with a first power source potential.

15. The active matrix liquid crystal display device according to claim 12, wherein the fourth terminal is provided to be supplied a second power source potential.

16. The active matrix liquid crystal display device according to claim 12, wherein the fifth terminal is an output terminal.

17. The active matrix liquid crystal display device according to claim 12, wherein the sixth terminal is a first input terminal.

18. The active matrix liquid crystal display device according to claim 12, wherein the same conductivity type is an N-channel type.

19. The active matrix liquid crystal display device according to claim 12, wherein the same conductivity type is a P-channel type.

20. The active matrix liquid crystal display device according to claim 12, further comprising a capacitor electrically connected between the fifth terminal and the gate electrode of the first thin film transistor.

21. The active matrix liquid crystal display device according to claim 12, wherein the first to fourth thin film transistors are included in one selected from the group consisting of an inverter, a buffer, and a level shifter.

22. An electronic equipment comprising the active matrix liquid crystal display device according to claim 12, wherein the electronic equipment is one selected from the group consisting of a liquid crystal display, a video camera, a notebook personal computer, a portable information terminal, an on-vehicle audio apparatus, a digital camera and a portable telephone.

23. An active matrix liquid crystal display device comprising:
a plurality of pixels arranged in a matrix, wherein one of the plurality of pixels includes a fifth thin film transistor; and
a driver circuit electrically connected to a gate of the fifth thin film transistor,
wherein the driver circuit comprises a first and a second circuit, each of which comprises:
a first thin film transistor having a first impurity region electrically connected to a first terminal;
a second thin film transistor having a first impurity region electrically connected to a second terminal;
a third thin film transistor having a first impurity region electrically connected to a third terminal;
a fourth thin film transistor having a first impurity region electrically connected to a fourth terminal; and
a first power supply line supplied with a first constant potential,
wherein:
the first to fourth thin film transistors have a same conductivity type,
a second impurity region of the first thin film transistor and a second impurity region of the second thin film transistor are electrically connected to a fifth terminal,
a second impurity region of the third thin film transistor and a second impurity region of the fourth thin film transistor are electrically connected to a gate electrode of the first thin film transistor,
a gate electrode of the second thin film transistor and a gate electrode of the fourth thin film transistor are electrically connected to a sixth terminal,
a gate electrode of the third thin film transistor is electrically connected to the first impurity region of the third thin film transistor,
the first terminal is electrically connected to the first power supply line, and
the fifth terminal of the first circuit is electrically connected to the sixth terminal of the second circuit.

24. The active matrix liquid crystal display device according to claim 23, wherein the second terminal is electrically connected to a second power supply line supplied with a second constant potential.

25. The active matrix liquid crystal display device according to claim 23, wherein the third terminal is electrically connected to the first power supply line.

26. The active matrix liquid crystal display device according to claim 23, wherein the fourth terminal is electrically connected to a second power supply line supplied with a second constant potential.

27. The active matrix liquid crystal display device according to claim 23, wherein the fifth terminal is an output terminal.

28. The active matrix liquid crystal display device according to claim 23, wherein the sixth terminal is an input terminal.

29. The active matrix liquid crystal display device according to claim 23, wherein the same conductivity type is an N-channel type.

30. The active matrix liquid crystal display device according to claim 23, wherein the same conductivity type is a P-channel type.

31. The active matrix liquid crystal display device according to claim 23, further comprising a capacitor electrically connected between the fifth terminal and the gate electrode of the first thin film transistor.

32. The active matrix liquid crystal display device according to claim 23, wherein the first circuit and the second circuit are included in one selected from the group consisting of an inverter, a buffer, and a level shifter.

33. An electronic equipment comprising the active matrix liquid crystal display device according to claim 23, wherein the electronic equipment is one selected from the group consisting of a liquid crystal display, a video camera, a notebook personal computer, a portable information terminal, an on-vehicle audio apparatus, a digital camera and a portable telephone.

34. A semiconductor device comprising a first circuit and a second circuit, each of which comprises:

a first thin film transistor having a first impurity region electrically connected to a first terminal;
a second thin film transistor having a first impurity region electrically connected to a second terminal;
a third thin film transistor having a first impurity region electrically connected to a third terminal; and
a fourth thin film transistor having a first impurity region electrically connected to a fourth terminal,
wherein:
the first to fourth thin film transistors have a same conductivity type,
a second impurity region of the first thin film transistor and a second impurity region of the second thin film transistor are electrically connected to a fifth terminal,
a second impurity region of the third thin film transistor and a second impurity region of the fourth thin film transistor are electrically connected to a gate electrode of the first thin film transistor,
a gate electrode of the second thin film transistor and a gate electrode of the fourth thin film transistor are electrically connected to a sixth terminal,
a gate electrode of the third thin film transistor is electrically connected to a seventh terminal,
the first terminal is provided to be supplied a first power source potential,
the fifth terminal of the first circuit is electrically connected to the sixth terminal of the second circuit, and
the sixth terminal of the first circuit is electrically connected to the seventh terminal of the second circuit.

35. The semiconductor device according to claim 34, wherein the second terminal is provided to be supplied with a second power source potential.

36. The semiconductor device according to claim 34, wherein the third terminal is provided to be supplied with the first power source potential.

37. The semiconductor device according to claim 34, wherein the fourth terminal is provided to be supplied with a second power source potential.

38. The semiconductor device according to claim 34, wherein the fifth terminal is an output terminal.

39. The semiconductor device according to claim 34, wherein the sixth terminal is a first input terminal.

40. The semiconductor device according to claim 34, wherein the seventh terminal is a second input terminal.

41. The semiconductor device according to claim 34, wherein the same conductivity type is an N-channel type.

42. The semiconductor device according to claim 34, wherein the same conductivity type is a P-channel type.

43. The semiconductor device according to claim 34, further comprising a capacitor electrically connected between the fifth terminal and the gate electrode of the first thin film transistor.

44. The semiconductor device according to claim 34, wherein the semiconductor device is one selected from the group consisting of an inverter, a buffer, and a level shifter.

45. An electronic equipment comprising the semiconductor device according to claim 34, wherein the electronic equipment is one selected from the group consisting of a liquid crystal display, a video camera, a notebook personal computer, a portable information terminal, an on-vehicle audio apparatus, a digital camera and a portable telephone.

46. The active matrix liquid crystal display device according to claim 12, wherein the first terminal is provided to be supplied with a first power source potential.

47. An active matrix liquid crystal display device comprising:

a plurality of pixels arranged in a matrix, wherein one of the plurality of pixels includes a thirteenth thin film transistor; and
a driver circuit electrically connected to a gate of the thirteenth thin film transistor,
wherein the driver circuit comprises:
 a first thin film transistor;
 a second thin film transistor;
 a third thin film transistor;
 a fourth thin film transistor;
 a fifth thin film transistor;
 sixth thin film transistor;
 a seventh thin film transistor;
 an eighth thin film transistor;
 a ninth thin film transistor;
 a tenth thin film transistor;
 an eleventh thin film transistor; and
 a twelfth thin film transistor, and
wherein a gate of the first thin film transistor is electrically connected to one of a source and a drain of the first thin film transistor,
the other of the source and the drain of the first thin film transistor is electrically connected to one of a source and a drain of the second thin film transistor and a gate of the third thin film transistor,
a gate of the second thin film transistor is electrically connected to a gate of the fourth thin film transistor,
the other of the source and the drain of the second thin film transistor is electrically connected to a first power supply line,
one of a source and a drain of the third thin film transistor is electrically connected to one of a source and a drain of the fourth thin film transistor, a gate of the sixth thin film transistor, a gate of the eighth thin film transistor and a gate of the ninth thin film transistor,
the other of the source and the drain of the fourth thin film transistor is electrically connected to the first power supply line,
a gate of the fifth thin film transistor is electrically connected to one of a source and a drain of the fifth thin film transistor,
the other of the source and the drain of the fifth thin film transistor is electrically connected to one of a source and a drain of the sixth thin film transistor and a gate of the seventh thin film transistor,
the other of the source and the drain of the sixth thin film transistor is electrically connected to the first power supply line,
one of a source and a drain of the seventh thin film transistor is electrically connected to one of a source and a drain of the eighth thin film transistor, a gate of the tenth thin film transistor and a gate of the twelfth thin film transistor,
the other of the source and the drain of the eighth thin film transistor is electrically connected to the first power supply line,
one of a source and a drain of the ninth thin film transistor is electrically connected to one of a source and a drain of the eleventh thin film transistor,
the other of the source and the drain of the ninth thin film transistor is electrically connected to a gate of the eleventh thin film transistor,
one of a source and a drain of the tenth thin film transistor is electrically connected to the first power supply line, and
one of a source and a drain of the twelfth thin film transistor is electrically connected to the first power supply line.

48. The active matrix liquid crystal display device according to claim 47, wherein the one of the source and the drain of the eleventh thin film transistor is electrically connected to a second power supply line.

49. The active matrix liquid crystal display device according to claim 47, wherein the one of the source and the drain of the first thin film transistor, the other of the source and the drain of the third thin film transistor, the one of the source and the drain of the fifth thin film transistor, the other of the source and the drain of the seventh thin film transistor, the one of the source and the drain of the ninth thin film transistor, and the one of the source and the drain of the eleventh thin film transistor are electrically connected to a second power supply line.

50. The active matrix liquid crystal display device according to claim 47, further comprising a first capacitor and a second capacitor, wherein a first electrode of the first capacitor is electrically connected to the gate of the third thin film transistor, and a second electrode of the first capacitor is electrically connected to the one of the source and the drain of the third thin film transistor, and wherein a first electrode of the second capacitor is electrically connected to the gate of the seventh thin film transistor, and a second electrode of the second capacitor is electrically connected to the one of the source and the drain of the seventh thin film transistor.

51. The active matrix liquid crystal display device according to claim 47, wherein the other of the source and the drain of the ninth thin film transistor is electrically connected to the other of the source and the drain of the tenth thin film transistor, and the other of the source and the drain of the eleventh thin film transistor is electrically connected to the other of the source and the drain of the twelfth thin film transistor.

52. The active matrix liquid crystal display device according to claim 47, wherein the first to twelfth thin film transistors are polysilicon thin film transistors.

53. The active matrix liquid crystal display device according to claim 47, wherein the first to twelfth thin film transistors are formed over a glass substrate.

* * * * *